United States Patent [19]
Treglio

[11] Patent Number: 5,317,235
[45] Date of Patent: May 31, 1994

[54] MAGNETICALLY-FILTERED CATHODIC ARC PLASMA APPARATUS

[75] Inventor: James R. Treglio, San Diego, Calif.

[73] Assignee: ISM Technolog, San Diego, Calif.

[21] Appl. No.: 35,309

[22] Filed: Mar. 22, 1993

[51] Int. Cl.⁵ .................................................. H01J 7/24
[52] U.S. Cl. ........................... 315/111.41; 315/111.31;
315/111.71; 315/111.81; 118/723 VE;
204/298.41
[58] Field of Search ................... 315/111.31, 111.41,
315/111.71, 111.81; 204/298.41; 118/723 VE

[56] References Cited
U.S. PATENT DOCUMENTS

| | | | |
|---|---|---|---|
| 3,566,185 | 2/1971 | Gavin . | |
| 3,836,451 | 9/1974 | Snaper . | |
| 3,970,892 | 6/1976 | Wakalopulos | 315/111.31 |
| 4,446,403 | 5/1984 | Cuomo et al. | 315/111.41 |
| 4,714,860 | 12/1987 | Brown et al. . | |
| 4,739,170 | 4/1988 | Varga | 315/111.81 |
| 4,952,843 | 8/1990 | Brown et al. | 315/111.41 |
| 4,977,352 | 12/1990 | Williamson | 315/111.81 |
| 5,013,578 | 5/1991 | Brown et al. | 118/723 VE |
| 5,059,866 | 10/1991 | Lo | 315/111.41 |
| 5,107,170 | 4/1992 | Ishikawa et al. | 315/111.21 |

*Primary Examiner*—John T. Kwon
*Attorney, Agent, or Firm*—Gilliam, Duncan & Harms

[57] ABSTRACT

A cathodic arc metal deposition apparatus that prevents the deposition of metal droplets with the metal ions being deposited. The cathode has an annular configuration. An annular solenoidal magnet is positioned adjacent to the cathode with their central openings in alignment. The opening diameters and spacings of the cathode and magnet is such that no line of sight exists between the cathode and a target to be coated. Preferably, the arc is initiated between the cathode and an annular anode located around the cathode, separated from the cathode by an insulating layer. The arc is initiated by a high voltage pulse formed between a trigger electrode ring within the cathode opening and the cathode. In an alternative embodiment, a plurality of individual cathodes are positioned in a circle in place of the single ring electrode. The anode may surround the set of cathodes, or may be a screen between the cathodes and the magnet. A multi-screen extractor is preferably provided to direct ions toward the target.

25 Claims, 2 Drawing Sheets

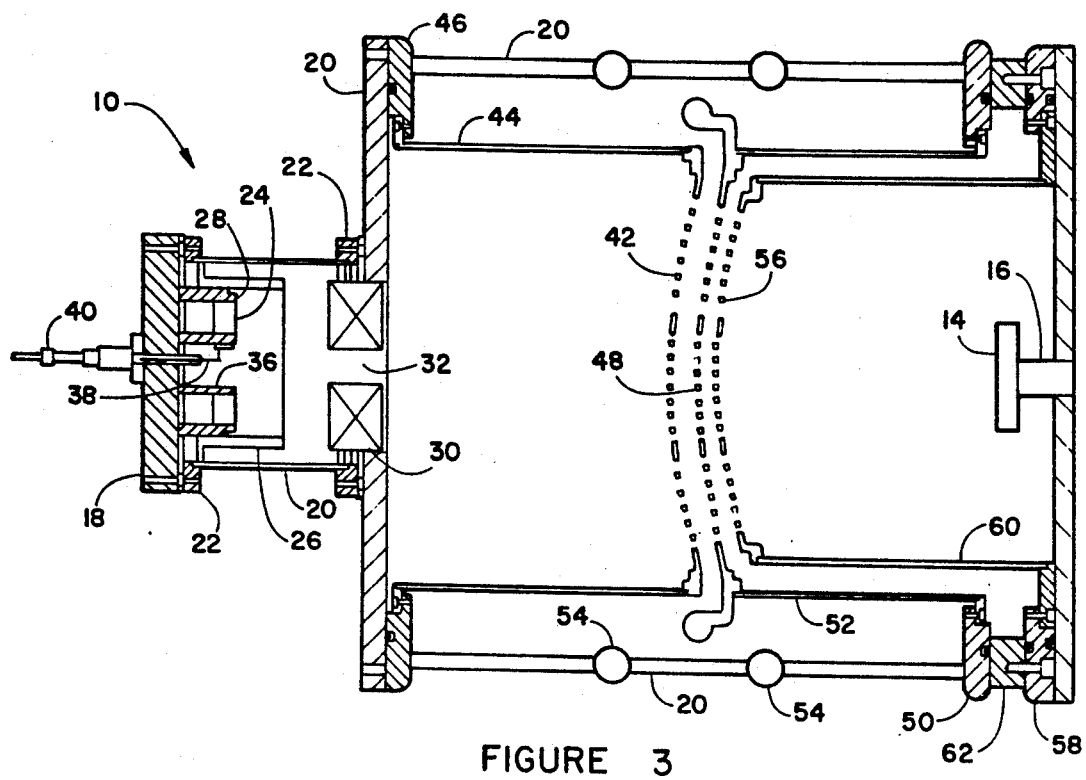
FIGURE 3
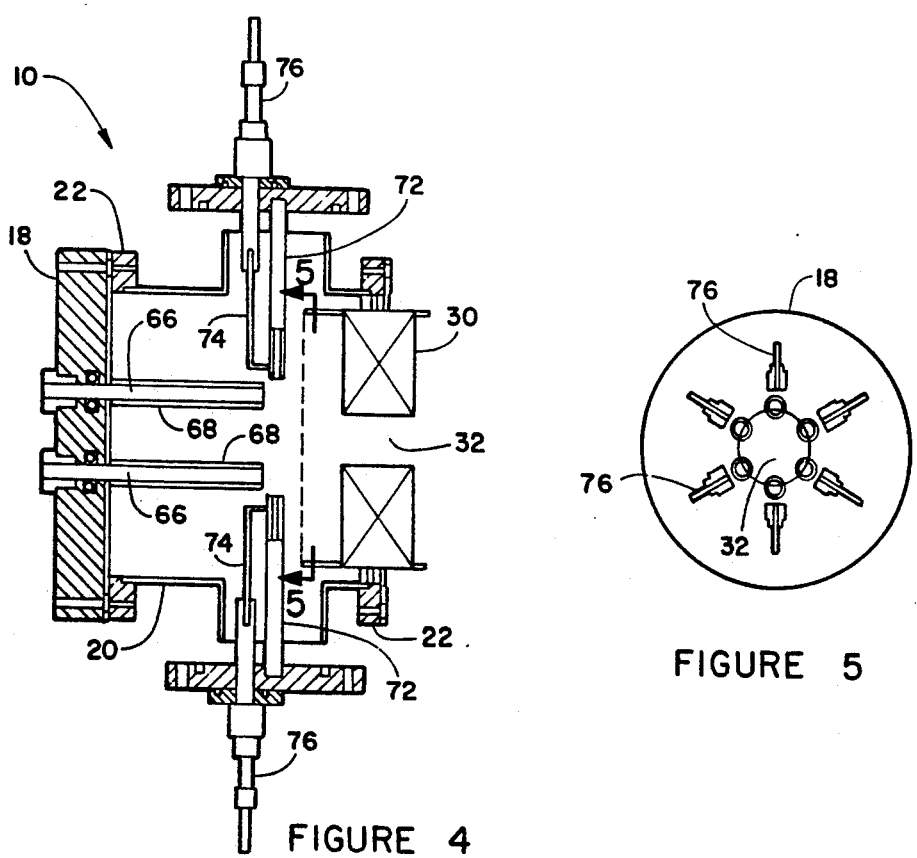
FIGURE 4
FIGURE 5

MAGNETICALLY-FILTERED CATHODIC ARC PLASMA APPARATUS

BACKGROUND OF THE INVENTION

This invention relates in general to cathodic arc deposition apparatus and, more particular to such an apparatus including means for separating metal droplets from the ion stream.

A number of different methods have been developed for depositing materials, generally metals, in the form of particles or ions onto a target surface to form an adherent, uniform coating. Among these are thermal deposition, cathode sputtering, chemical vapor deposition. While useful in particular applications, these methods suffer from several problems, including tending to coat other system surfaces than the target with the material being deposited, requiring frequent cleaning, contamination problems when the coating material is changed and a waste of often expensive coating material. Generally, these processes require that the target surface be heated to a very high temperature which often damages the target material, especially when the target is an organic material or an organic matrix composite material. The high deposition temperatures also lead to thermal stresses that may cause coating delamination.

Vacuum arc deposition has a number of advantages for coating difficult materials, such as refractory metals, onto targets. Vacuum arc deposition involves establishing of an arc, in a vacuum, between a cathode formed from the coating material and an anode, which results in the production of a plasma of the cathode material suitable for coating. The process does not involve gases, making control of deposition rate easier and simplifies changing coating materials. Typical vacuum arc deposition systems are described in U.S. Pat. Nos. 3,566,185, 3,836,451 and 4,714,860. Vacuum arc deposition, often referred to as cathodic arc deposition, is used commercially, typically to produce titanium nitride coatings on tooling.

Cathodic arc deposition, unfortunately, generates droplets of metal along with the metal ion plasma. These droplets, often called macro-particles, typically have diameters of from about 1 to 50 micrometers. The droplets travel outward from the cathode surface at such velocities that they often stick to the surface to be coated. Thus, cathodic arc coatings are often contaminated with macro-particles that adhere to the target surface, or leave holes where they once clung but have since been removed. The adhering macro-particles have little affect on wear resistance but each hole represents a site for corrosion to commence.

Thus, there is a significant, continuing, need for methods and apparatus to prevent or reduce the deposition of macro-particles while forming uniform, adherent metal or metal compound coatings on target surfaces.

SUMMARY OF THE INVENTION

The above-noted problems, and others, are overcome by the apparatus of this invention, which basically includes a generally annular cathode means (either a single annular cathode or a circle of individual cathodes), an anode spaced from the cathode, and an annular solenoidal magnet spaced from the cathode, between the cathode and the target to be coated. The opening in the annular magnet is aligned with the center of the annular single cathode or group of cathodes such that there is no line of sight between the cathode and the target.

The anode may have an annular configuring surrounding, and electrically insulated from, the cathode means. Typically, the anode extends further toward the magnet than does the cathode assembly. Alternatively, the anode may be in the form of a screen positioned between the cathode and the magnet.

The arc may be initiated in any suitable manner. The means for igniting the plasma between the cathode and anode may be an electrode mounted on a movable arm that is swung into contact with the cathode to initiate the discharge, then moved away after the arc is running properly. A particularly preferred initiation system includes a trigger ring around the opening in the cathode, insulated from the cathode. A high voltage pulse is formed between the trigger ring and the cathode from a trigger electrode in contact with the trigger ring. This arrangement can ignite the plasma in a much shorter time that the mechanical, swinging arm, embodiment, thus facilitating re-ignition of the arc.

With the annular arrangement of individual cathodes, one plasma trigger is provided for each cathode, typically positioned along the outside of the ring of cathodes. With this arrangement some or all of the cathodes can be ignited, as desired. Also, different cathodes can be formed from different materials, so that the content of the plasma can be changed by changing cathodes, permitting coating layers of different materials or mixed layers to be formed.

A target may be positioned opposite the magnet to be coated. The target may or may not, as desired, be insulated from the chamber. If insulated, it may be biased negatively by a continuous or pulsed voltage (or both) to increase the energy of deposition and thus improve coating quality and adhesion. If desired, all or some surfaces can be cooled by water or another suitable liquid.

In another preferred embodiment, the filtered source may be used as a plasma source for an ion source. A plasma electrode, in the form of a grid or screen, is positioned between the magnet and the target. The plasma electrode is attached to a wide conductive sleeve that is attached to the plasma source structure all of which is held at a high positive voltage, typically in the range of from about 20 to 100 kilovolts. A suppressor electrode is spaced from the plasma electrode on the target side thereof. The suppressor electrode is supported by a sleeve held at a negative potential of about $-1$ to $-4$ kilovolts, typically about $-3$ kilovolts. A ground electrode is positioned on the target side of the suppressor electrode and mounted on a sleeve connected to ground, providing the ground plane for the system.

When the plasma reaches the extractor region, the ions in the plasma are pulled out of the plasma by the high voltage between the plasma electrode and the suppressor electrode. The electrons, in turn, are repulsed. The ions achieve the energy of the voltage between the plasma electrode and the ground, and can be used for ion implantation or other purposes where a beam of high energy metal ions can be used.

In general, a system with cylindrical symmetry is preferred for convenience in assembling the components. However, other geometries, such as rectangular, may be used if desired.

BRIEF DESCRIPTION OF THE DRAWING

Details Of the invention, and of certain preferred embodiments thereof, will be further understood upon reference to the drawing, wherein:

FIG. 3 is a schematic axial section view through a second embodiment of the cathodic arc deposition apparatus;

FIG. 4 is a schematic axial section view through a second embodiment of the cathode arc source; and FIG. 5 is a section view taken on line 5—5 in FIG. 4.

DETAILED DESCRIPTION OF PREFERRED EMBODIMENTS

Figure 1:
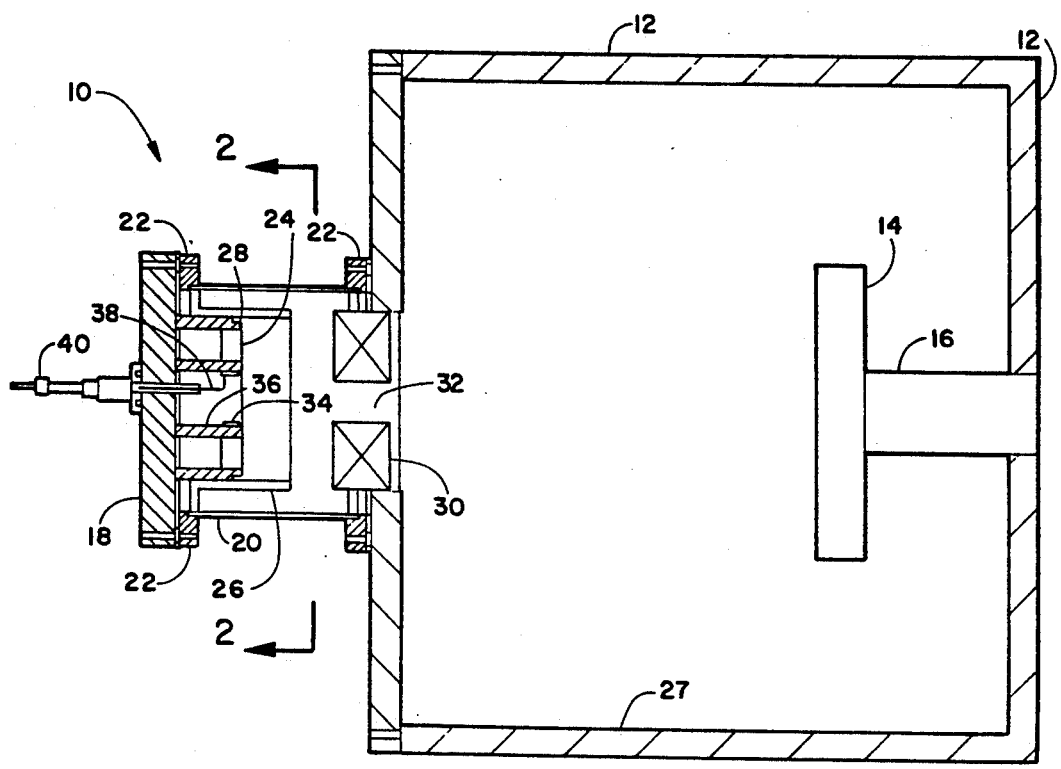
FIG. 1 is a schematic axial section view through the cathodic arc deposition apparatus of this invention.

Referring now to FIG. 1, there is seen a cathode arc source 10 communicating with a vacuum chamber 12. A target 14 to be coated is mounted on a pedestal 16 opposite source 10. Pedestal 16 may, or may not, insulate target 14 from chamber 12. If the pedestal 16 is insulating, target may be biased (through a wire or the like, not shown) negatively with a continuous or pulsed voltage (or both) to increase the energy of deposition and improve coating quality and adhesion.

Figure 2:
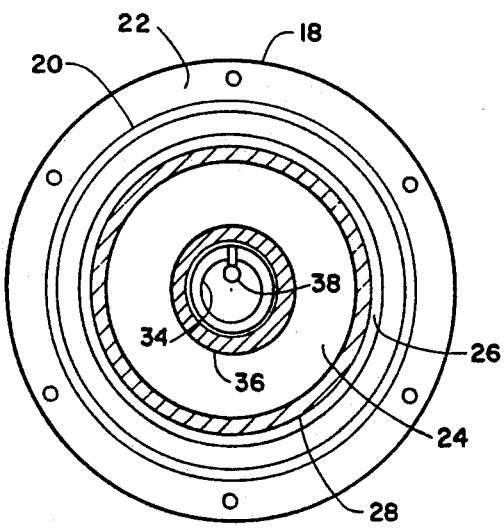
FIG. 2 is a section view taken on line 2—2 in FIG. 1.

Cathode arc source 10 includes a base plate 18 with a tubular housing 20 sealed to base plate 18 and chamber 12. Insulating rings 22 electrically isolate housing 20 from base plate 18 and chamber 12. An annular cathode 24 (as seen in FIGS. 1 and 2) is mounted on base plate 18. Cathode 24 can be formed from any metal or metal compound that an operator may wish to deposit on target 14. Typical cathode materials include titanium, chromium, silver, molybdenum and aluminum. An annular anode 26 surrounds cathode 24 and is electrically isolated therefrom by insulation 28. Anode 26 is mounted on housing 20. Anode 26 may be formed from any suitable conductive material, such as copper, aluminum, tantalum and molybdenum.

A solenoidal magnet 30 is positioned at the opening into chamber 12 and has an inner bore 32 such that there is no direct line, or line of sight, between any part of cathode 24 and target 14. Thus, any metal droplets or macro-particles emitted by cathode 24 which move in straight lines, will be not be able to impact target 14. Any suitable solenoidal magnet may be used.

In the embodiment shown, a metal trigger ring 34 is positioned within the opening within annular cathode 24 and isolated therefrom by electrically insulating material 36. The cathode arc is initiated by a high voltage pulse which is formed between trigger ring 34 and cathode 24 from a trigger electrode 38 entering via a feedthrough 40 through base plate 18.

An alternate embodiment of the deposition apparatus is shown in FIG. 3. The source assembly 10 is basically the same as is shown in FIG. 1 and 2. However, the means for igniting the cathode arc is different. Here, trigger ring 34 shown in FIG. 1 is eliminated, and trigger electrode 38 is rotatable through feedthrough 40 to bring the end of electrode 38 into contact with cathode 24 through an opening in insulation 36. Once the arc is running properly, the end of electrode 38 is rotated away from cathode 24. However, the arrangement using trigger ring 34 as shown in FIG. 1 is preferred since it can ignite the plasma in a much shorter time, thus facilitating re-ignition of the arc.

Housing 20 in this embodiment contains a plurality of electrodes to enhance performance. Here, as the plasma produced by the cathode arc drifts out through bore 32 in magnet 30, it reaches the plasma electrode 42, a metal sheet with a plurality of holes. Plasma electrode 42 is attached to the plasma source through sleeve 44. Electrode 42 and sleeve 44 are held at a high positive voltage, in the range of 20 to 200 kilovolts. A suppressor electrode 48 attached to suppressor flange 50 by sleeve 52 is positioned adjacent to plasma electrode, with holes in each of these electrodes aligned. Suppressor electrode 48 is held at a negative potential of from about $-1$ to $-4$ kilovolts and serves to prevent electrons from passing back into the plasma region between source 10 and plasma electrode 42. Insulating rings 54 divide the cylindrical wall of housing 20 to electrically isolate flanges 46 from flanges 50. A ground electrode 56 is positioned adjacent to suppressor electrode 48 with holes aligned with the holes in the other two electrodes to provide the ground plane for the system. Ground electrode 56 is attached to ground flange 58 through sleeve 60 and electrically isolated from flange 50 by an insulation ring 62.

In operation, when the plasma reaches the extractor region, the ions in the plasma are pulled out of the plasma by the high voltage between the plasma electrode 42 and the suppressor electrode 48. The electrons, in turn, are repulsed. The ions achieve the energy of the voltage between plasma electrode 42 and ground electrode 56, and can be used for ion implantation on target 14 or other purposes where a beam of high energy metal ions can be used.

An alternative embodiment of source 10 is shown in FIGS. 4 and 5. A plurality of independent, rod-shaped cathodes 66 are arranged in a circle on base plate 18. Each is covered on the sides by insulation 68. In the embodiment shown, the anode 70 is in the form of a screen. If desired, an annular anode as shown in FIGS. 1 and 2 could be used. Individual electrode rods 72 are provided adjacent to each cathode 66, each actuated by a trigger electrode 74 entering through an individual feed through 76. Pulsing the high voltage through the trigger electrodes 74 controls the pulsing of the individual cathodes 66. Since different cathodes may be of different materials, mixed or layered coatings can be formed, including superlattices which are known to have excellent mechanical properties.

Other applications, variations and ramifications of this invention will occur to those skilled in the art upon reading this disclosure. For example, the source and housing may have configurations other than the preferred cylindrical shape. Those are intended to be included within the scope of this invention, as defined in the appended claims.

I claim:

1. A magnetically filtered cathodic arc deposition apparatus which comprises:
   generally annular cathode means;
   anode means spaced from said cathode means;
   cathode arc initiating means adjacent to said cathode means;
   a target area spaced from said cathode means adapted to contain a target to receive ions generated at said cathode means;
   an annular solenoidal magnet spaced from said cathode means, between said cathode means and said target;

the opening in said annular magnet being aligned with said cathode means such that no straight line exists between any location on said cathode means and any location on said target area.

2. The apparatus according to claim 1 wherein said cathode means is a single annular cathode.

3. The apparatus according to claim 1 wherein said cathode means is a circular array of spaced independent cathodes.

4. The apparatus according to claim 3 wherein said independent cathodes are each rod shaped and extend toward said magnet.

5. The apparatus according to claim 1 wherein said anode means is a single annular anode surrounding said cathode means and further including electrically insulating material between said anode and said cathode means.

6. The apparatus according to claim 1 wherein said anode means is a screen anode positioned between said cathode means and said magnet.

7. The apparatus according to claim 1 wherein said cathode arc initiating means comprises a movable trigger electrode movable into and out of contact with said cathode means.

8. The apparatus according to claim 1 wherein said cathode arc initiating means comprises a trigger ring within said annular cathode means and electrically insulated therefrom and trigger electrode means for directing a high voltage pulse into said trigger ring.

9. The apparatus according to claim 1 wherein said cathode means is a circular array of spaced independent cathodes and an individual cathode arc initiating means is provided adjacent to each cathode, whereby a selected number of cathodes can be triggered at any selected time.

10. The apparatus according to claim 1 further including a plasma electrode positioned between said magnet and said target area, a suppressor electrode positioned between said plasma electrode and said target area and a ground electrode positioned between said suppressor electrode and said target area, each of said plasma electrode, suppressor electrode and ground electrode having a plurality of holes, the holes in all electrodes being aligned.

11. The apparatus according to claim 10 wherein said plasma electrode is maintained at a positive voltage of from about 20 to 100 kilovolts, said suppressor electrode is maintained at a negative voltage of from about −1 to −4 kilovolts, and said ground electrode provides a ground plane.

12. A magnetically filtered cathodic arc plasma source which comprises:
a generally annular cathode means;
anode means spaced from said cathode means;
cathode arc initiating means adjacent to said cathode means;
an annular solenoid magnetic spaced from said cathode means;
the opening in said annular cathode means being aligned with the opening in said annular solenoidal magnet so that no straight line exists from any portion of said cathode, through said magnet opening to any location on a target area lying along the axis of said annular cathode and annular magnet, whereby no macro-particles emitted by said cathode can impact said target area.

13. The apparatus according to claim 12 wherein said cathode means is a single annular cathode.

14. The apparatus according to claim 12 wherein said cathode means is a circular array of spaced independent cathodes.

15. The apparatus according to claim 14 wherein said independent cathodes are each rod shaped and extend toward said magnet.

16. The apparatus according to claim 12 wherein said anode means is a single annular anode surrounding said cathode means and further including electrically insulating material between said anode and said cathode means.

17. The apparatus according to claim 12 wherein said anode means is a screen anode positioned between said cathode means and said magnet.

18. The apparatus according to claim 12 wherein said cathode arc initiating means comprises a movable trigger electrode movable into and out of contact with said cathode means.

19. The apparatus according to claim 12 wherein said cathode arc initiating means comprises a trigger ring within said annular cathode means and electrically insulated therefrom and trigger electrode means for directing a high voltage pulse into said trigger ring.

20. The apparatus according to claim 12 wherein said cathode means is a circular array of spaced independent cathodes and an individual cathode arc initiating means is provided adjacent to each cathode, whereby a selected number of cathodes can be triggered at any selected time.

21. The method of magnetically filtered cathodic arc deposition which comprises:
providing an annular cathode means having anode means spaced therefrom;
positioning an annular solenoid magnet adjacent to said cathode with said cathode and the bore of said magnet aligned so that no straight line exists between any portion of said cathode and any location on a target area lying along the axis of said magnet; and
initiating a cathode arc;
whereby macro-particles emitted by said cathode do not impact said area.

22. The method according to claim 21 wherein said annular cathode is provided by arranging a plurality of individual cathode means in a circle and initiating a cathode arc at selected ones of said individual cathodes.

23. The method according to claim 22 wherein at least some of said cathodes are formed from different materials, and those cathodes are selectively initiated to form layers of those different materials or mixtures of those different materials in said area.

24. The method according to claim 21 further including the steps receiving plasma exiting the bore of said magnet, directing ions at high energy levels toward said area while suppressing electrons.

25. The method according to claim 21 wherein said cathode arc is initiated by imposing a high voltage pulse between a trigger ring adjacent to said cathode and said cathode.

* * * * *